(12) United States Patent
Ma

(10) Patent No.: US 7,179,092 B2
(45) Date of Patent: Feb. 20, 2007

(54) LAND GRID ARRAY CONNECTOR WITH DISTORTION GAP

(75) Inventor: Hao-Yun Ma, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/001,853

(22) Filed: Dec. 1, 2004

(65) Prior Publication Data
US 2005/0124188 A1 Jun. 9, 2005

(30) Foreign Application Priority Data
Dec. 9, 2003 (TW) ............................. 92221601 U

(51) Int. Cl.
*H01R 12/00* (2006.01)
(52) U.S. Cl. ................... 439/73; 439/330; 439/342
(58) Field of Classification Search ............ 439/71–73, 439/330–331, 342
See application file for complete search history.

(56) References Cited

U.S. PATENT DOCUMENTS 6,406,318 B1 * 6/2002 Liao et al. ................. 439/342
6,916,195 B2 * 7/2005 Byquist ..................... 439/342

* cited by examiner

*Primary Examiner*—Truc Nguyen
(74) *Attorney, Agent, or Firm*—Wei Te Chung

(57) ABSTRACT

An LGA connector (1) includes an insulative housing (2), a stiffener (3) defined around the housing, a clip (4) pivotably engaged on one end of the stiffener, and a lever (5) engaged on an opposite end of the stiffener for fastening the clip onto the housing. The stiffener includes a bottom plate (31) and a plurality of side walls (32) extending from the bottom plate, and the housing defines two raised lower surfaces (210) in two opposite ends thereof. Said ends is corresponding to the ends of the stiffener that engages lever and clip respectively, and each lower surface and the bottom plate defining a gap therebetween. Thus, even if two ends of the stiffener bend, the gaps will avoid the housing from distorting alone with the stiffener.

15 Claims, 5 Drawing Sheets

LAND GRID ARRAY CONNECTOR WITH DISTORTION GAP

BACKGROUND OF THE INVENTION

1. Field of the Invention

The present invention relates to an electrical connector for electrically connecting an electronic package such as an integrated circuit (IC) chip with a circuit substrate such as a printed circuit board (PCB), and particularly to a land grid array connector adapted for receiving a land grid package (LGP) therein and electrically connecting the LGP with a PCB.

2. Description of the Prior Art

Land grid array (LGA) connector for electrically connecting a Land Grid Package (LGP) with a printed circuit board (PCB) is widely used in the field of electrical connectors. The LGA connector typically comprises an insulative housing, a stiffener defined around the housing, a clip pivotably engaged on one end of the stiffener, and a lever engaged on an opposite end of the stiffener for fastening the clip onto the housing. The LGP is clasped between the clip and the housing.

Referring to FIGS. 5–6, a conventional Land Grid Array (LGA) connector is illustrated. The LGA connector 6 comprises an insulative housing 61 mounted on a printed circuit board (not shown), a stiffener 62 defined around the housing 61, a metal clip 63 pivotably engaged on one end of the stiffener 62, and a lever 64 engaged on an opposite end of the stiffener 62 for fastening the clip 63 onto the housing 61. The housing 61 comprises a supporting portion 611 for supporting an LGP 7 and a mounting portion 612 for being mounted in the stiffener 62. The supporting portion 611 and the mounting portion 512 each have rectangular plane plate configuration with a plurality of sides. Each side of the supporting portion 611 extends beyond corresponding side of the mounting portion 612, and therefore steps 613 are formed between corresponding sides of the supporting portion 611 and the mounting portion 612. The clip 63 comprises a pair of clasping portions 631 in the middle thereof and a pair of hooks 632 in one end for engaging with the stiffener 62.

The stiffener 62 comprises a bottom plate 621 and a plurality of side walls 622 extending from the bottom plate 621. The bottom plate 621 defines a middle window and four connecting portions therearound. The bottom plate 621 and the side walls cooperatively define a room for receiving the LGP 7. The middle window receives the mounting portion 612, and the connecting portions around the middle window support the steps 613 of the housing 61. The stiffener 62 further comprises a lath 623 extending outside from one side wall 622.

The lever 64 comprises an operation lever 641 and a mounting lever 642. The mounting lever 642 comprises an arched pressing portion 6422 in the middle for pressing the clip 63.

In use, the clip 63 is first rotated to a vertical open position, and the LGP 7 is seated onto a predetermined position of the housing 61. Then the clip 63 is rotated to a horizontal close position. When the clip 63 is fittingly rested on LGP 7, the operation lever 641 is actuated, and the pressing portion 6422 presses a end of the clip 63. When the operation lever 641 is rotated to horizontal, the latch 623 locks the operation lever 641, and therefore the housing 61 and LGP 7 are fastened between the stiffener 62 and the clip 63.

Because the lever 64 presses down on the clip 63, and the clasping portions 631 of the clip 63 press down on the LGP 7, the lever 64 simultaneously pulls up the end of the stiffener 62 thereat to counterbalance the pressing forces. In addition, the hooks 632 of the clip 63 tend to pull up the opposite end of the stiffener 62 thereat, to counterbalance the pressing forces of the clasping portions 631 of the clip 63.

Generally, the force required for the clasping portions 631 of the clip 63 to firmly retain the LGP 7 thereunder is considerable. Accordingly, the pressing force applied by the lever 64 on the clip 63 is also considerable. The result is that the pulling up force of the lever 64 is considerable, and the pulling up force of the clip 63 is also considerable.

Said pulling up forces operate on the opposite ends of the stiffener 62 respectively, and the pressing forces of the clasping portions 631 operate to press a center portion of the LGP 7. The stiffener 62 is limited rigid, and the opposite ends of the stiffener 62 tend to bend upward. Because the supporting portion 611 is fixedly seated on the sides of the stiffener 62, the corresponding ends of the housing 61 is prone to bend upward alone with the bended end of the stiffener 62. That is, distortion of the housing 61 is occurred. The upshot is that firm and reliable electrical connection between the LGP 7 and the housing 61 is diminished.

In view of the above, a new LGA connector which overcomes the above-mentioned disadvantages is desired.

SUMMARY OF THE INVENTION

Accordingly, an object of the present invention is to provide an LGA connector that can prevent the housing from bending alone with the stiffener, therefore ensuring reliability connecting performance of the LGA connector.

To achieve the above-mentioned object, an LGA connector in accordance with the present invention comprises an insulative housing, a stiffener defined around the housing, a clip pivotably engaged on one end of the stiffener, and a lever engaged on an opposite end of the stiffener for fastening the clip onto the housing. The stiffener comprises a bottom plate and a plurality of side walls extending from the bottom plate, and the housing comprises a supporting portion seated on the bottom plate of the stiffener. The supporting portion of the housing defines two raised steps in two ends thereof, corresponding to the ends of the stiffener that engages lever and clip respectively. Therefore, a gap is formed between the raised step and the bottom plate. Thus, even if two ends of the stiffener bend, the gaps will avoid the housing from distorting alone with the stiffener.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
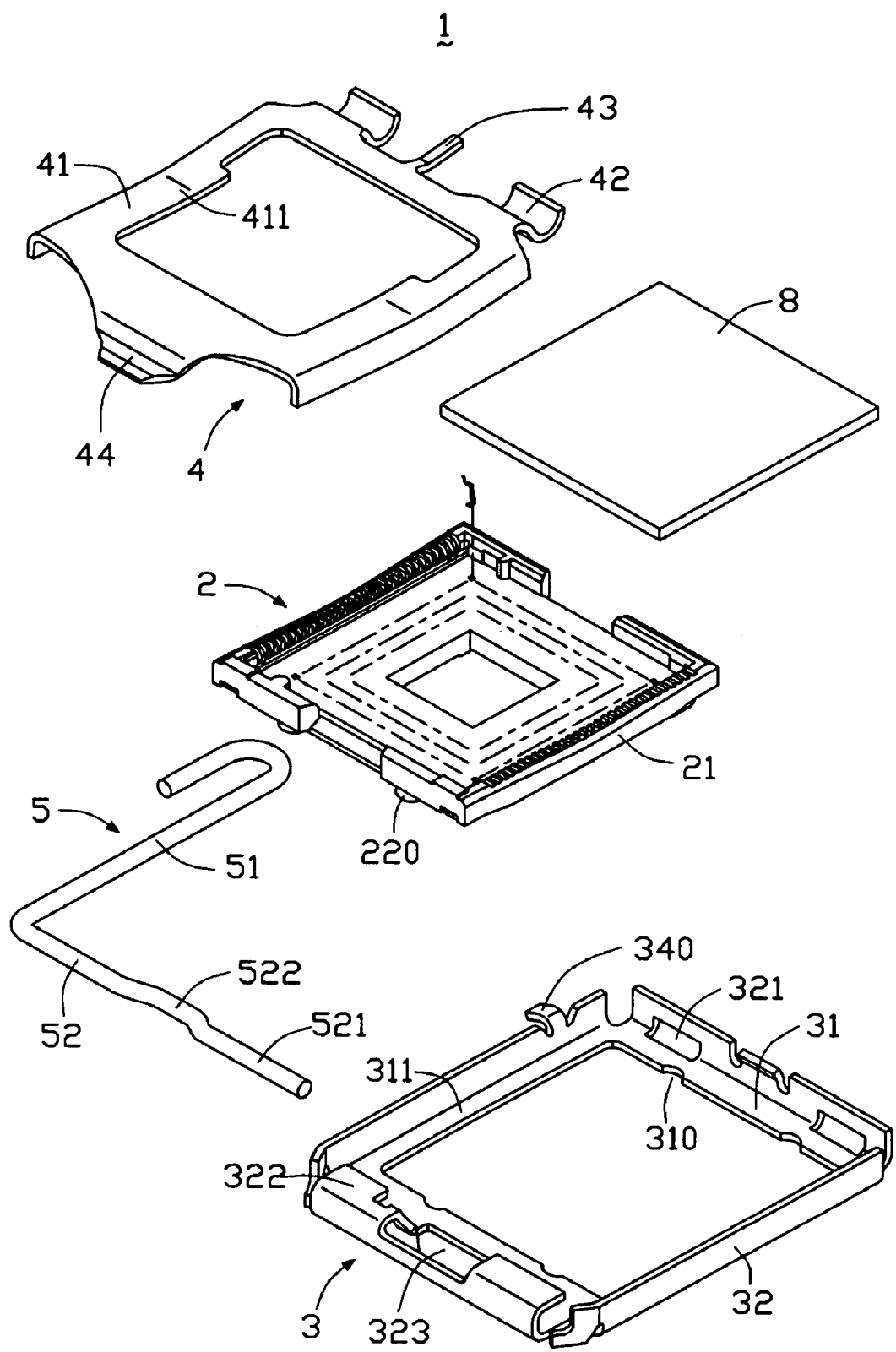
FIG. 1 is an exploded, isometric view of a land grid array connector in accordance with the embodiment of the present invention, together with a land gird package ready to be mounted onto a housing of the connector.
Figure 2:
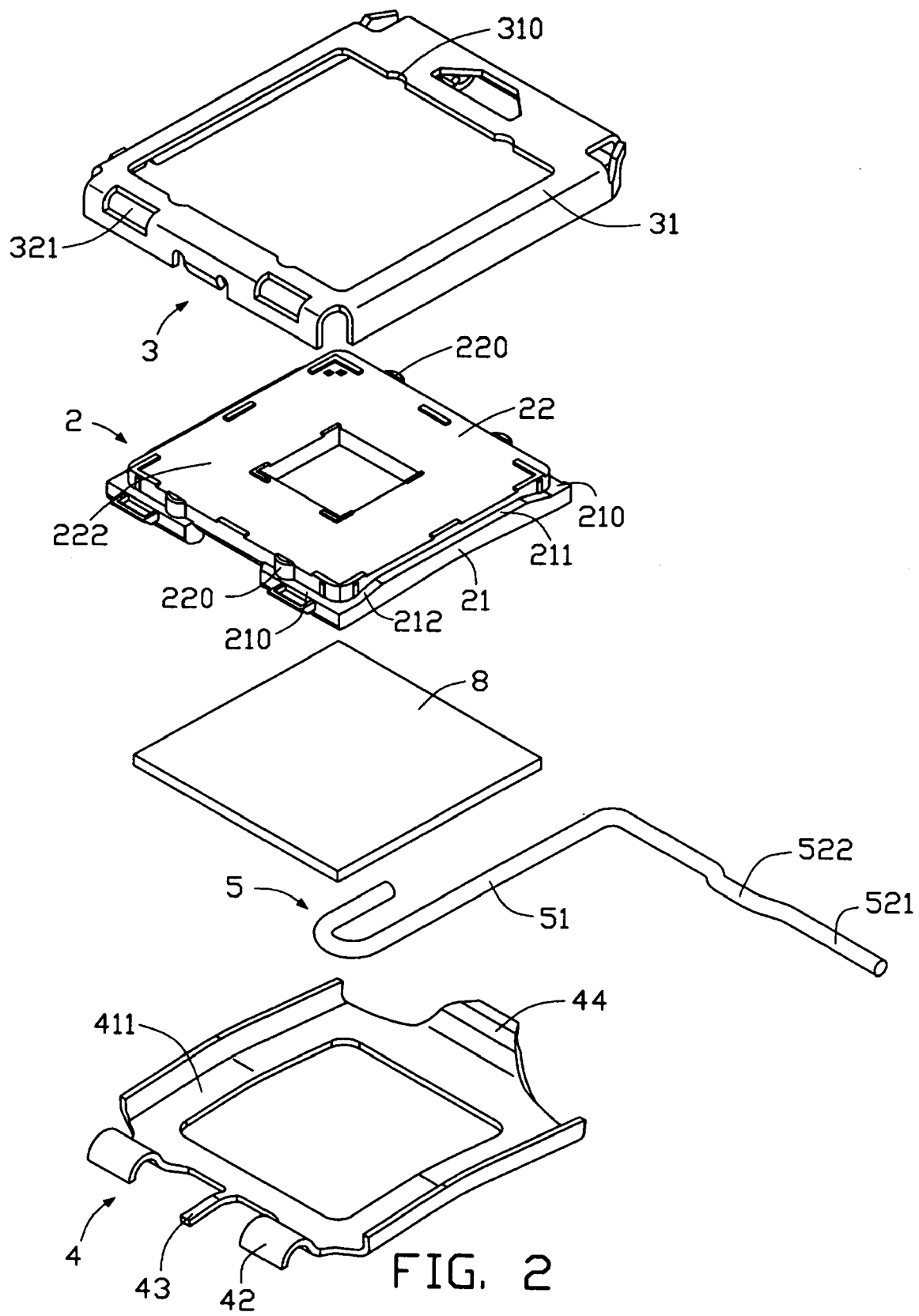
FIG. 2 is an inverted exploded, isometric view of the land grid array connector in FIG. 1.
Figure 3:
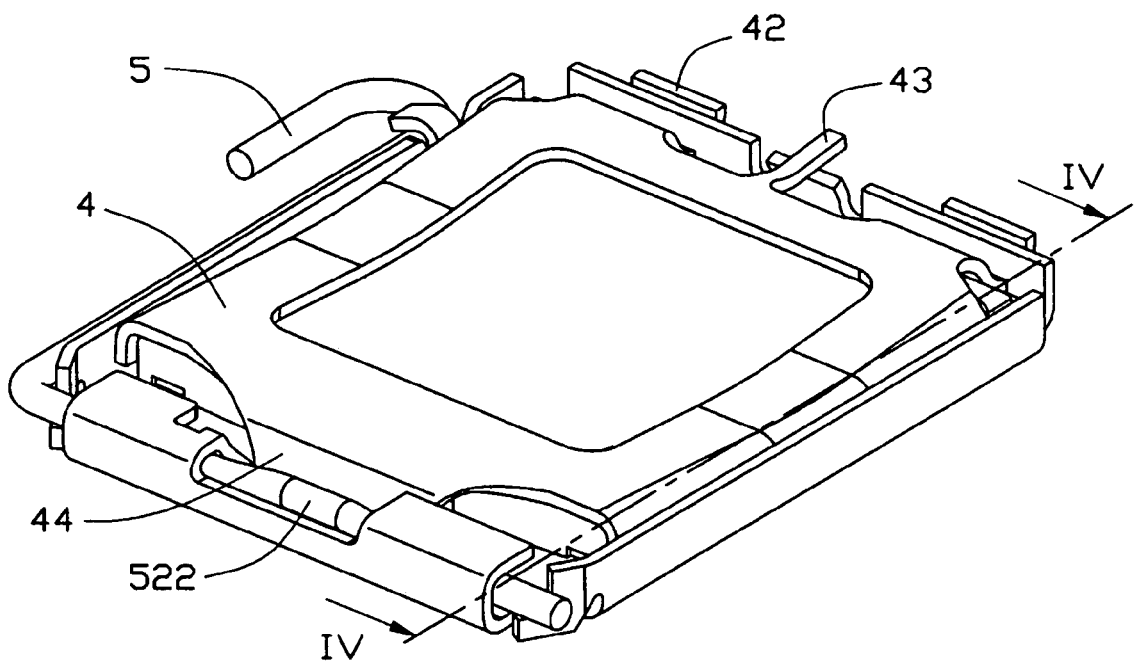
FIG. 3 is an assembled, isometric view of the land grid array connector of FIG. 1.
Figure 4:
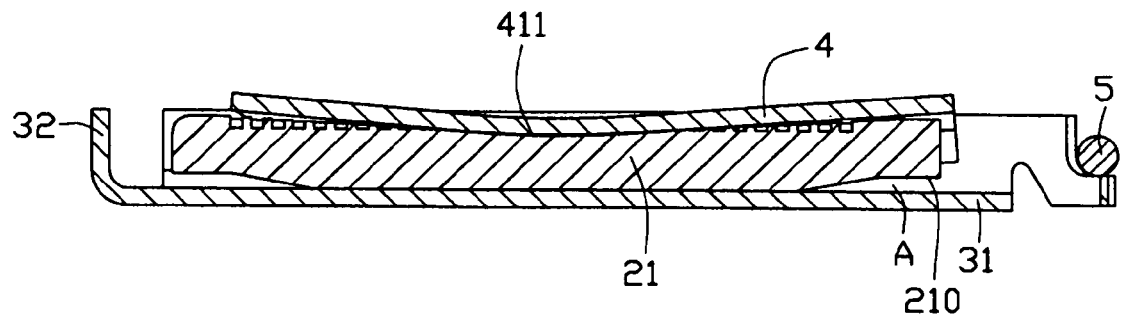
FIG. 4 is a cross-sectional view taken alone line IV—IV in FIG. 3.
Figure 5:
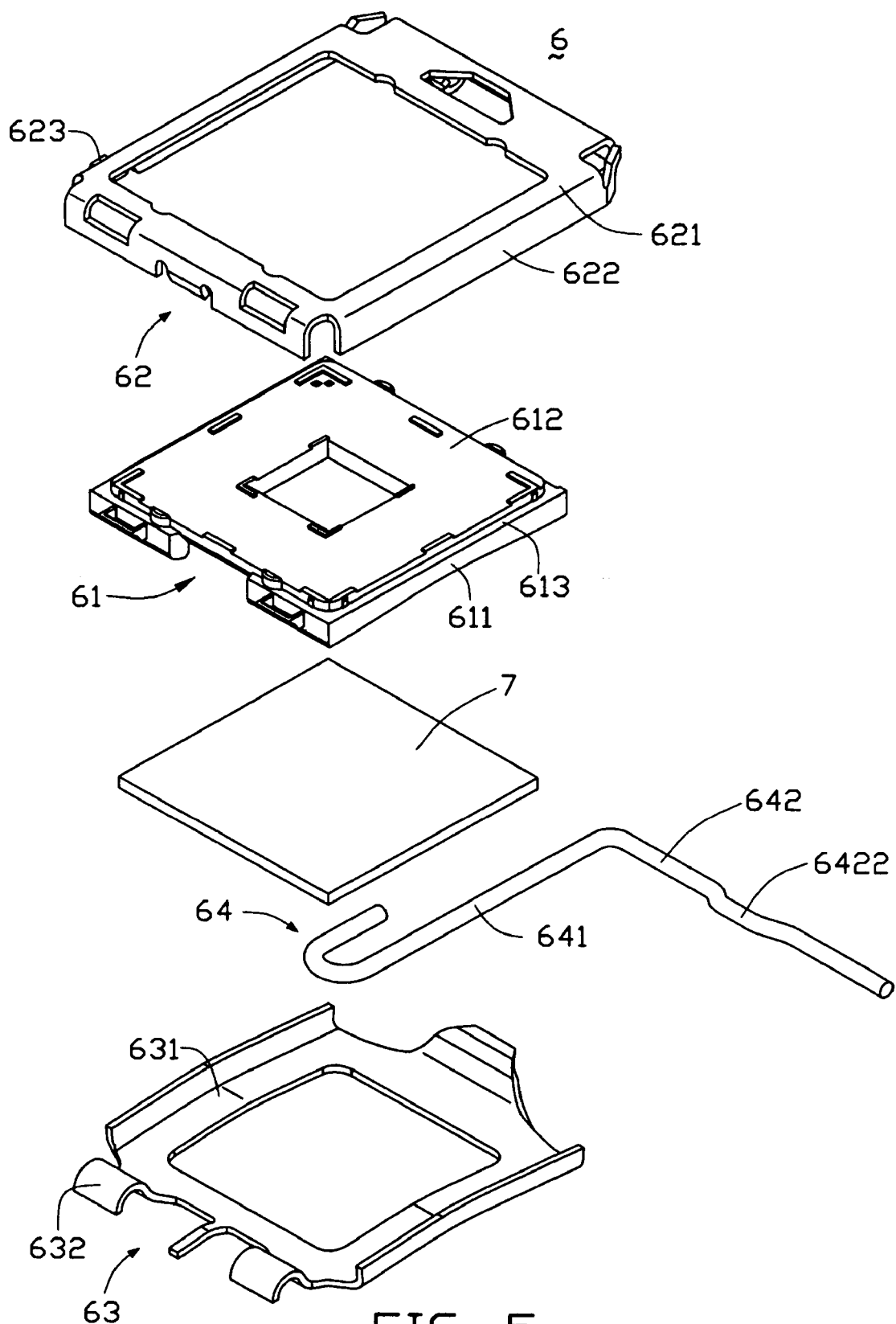
FIG. 5 is an exploded, isometric view of a conventional land grid array connector, together with a land grid package ready to be mounted onto the housing of the land grid array connector.
Figure 6:
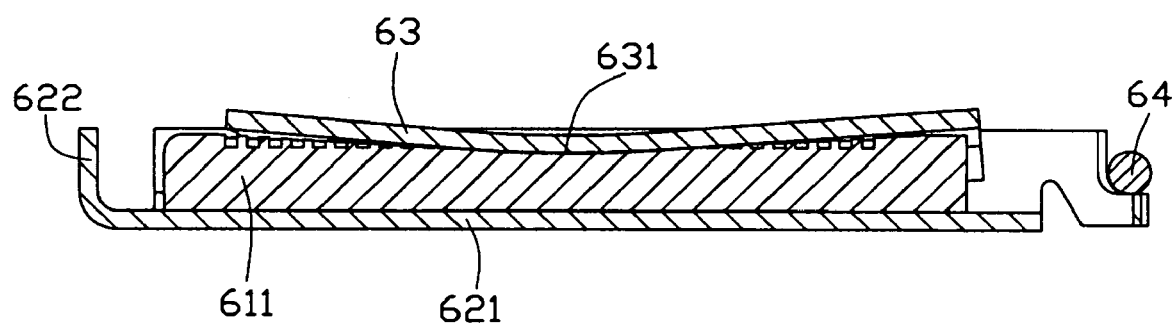
FIG. 6 is similar to FIG. 4, but showing a cross-sectional view of the conventional land grid array connector of FIG. 5.

Referring to FIGS. 1–4, a land grid array connector 1 in accordance with the embodiment of the present invention comprises an insulative housing 2 mounted on a printed circuit board (not shown), a stiffener 3 defined around the housing 2, a metal clip 4 pivotably engaged on one end of the stiffener 3, and a lever 5 engaged on an opposite end of the stiffener 3 for fastening the clip 4 onto the housing 2. A Land Grid Package (LGP) 8 is ready to be disposed between the housing 2 and the clip 4, for connecting with the printed circuit board via the connector 1.

The housing 2 is substantially rectangular. A plurality of passageways (not labeled) is defined in the housing 2 for receiving a corresponding number of electrical contacts (not labeled) therein. The housing 2 comprises a supporting portion 21 and a mounting portion 22 integrally connecting with the supporting portion 21. The supporting portion 21 and the mounting portion 22 each have a rectangular plane plate configuration with four sides. Each side of the supporting portion 21 extends beyond corresponding side of the mounting portion 22, and therefore steps are formed between corresponding sides of the supporting portion 21 and the mounting portion 22. The steps comprise two first parallel steps 211 and two second parallel steps 210 perpendicular to the first steps 211. Each end of the first steps 211 defines a tapered surface connecting with the second step 210, and distance between the raised second steps 210 and the bottom surface 222 of the mounting portion 22 is greater than the distance between the first steps 211 to the bottom surface 222. Furthermore, two opposite sides of the mounting portion 22 defines a plurality of protrusions 220 extending therefrom.

The stiffener 3 comprises a bottom wall 31 and four side walls 32 extending upwardly from the bottom wall 31. The bottom wall 31 and side walls 32 cooperatively define a receiving room for accommodating the housing 2. The bottom wall 31 defines a middle window for receiving the mounting portion 22 of the housing 2 and four connecting portions 311 around the middle window. Two opposite edges of the window each define a plurality of recesses 310 for engaging with the protrusions 220 of the mounting portion 22.

When the housing 2 is mounted in the stiffener 3, the middle window of the stiffener 3 receives the mounting portion 22, and the protrusions 220 engage with the recesses 310. The first steps 211 seat on the connecting portion 311 of the bottom plate 31, and the second steps 210 are corresponding to the side walls 32 that mount the lever 5 and the clip 4 respectively. Because the second steps 210 are relatively farer away from the bottom surface 222, a gap A is formed between the second steps 210 and corresponding connecting portions 311.

One side wall 32 of the stiffener 3 defines a pair of slots 321, and the opposite wall 32 define a pair of restricting portion 322 at two ends thereof. A recess 23 is defined between the two mounting portion 322. On one of the other two side walls 32, a latch 340 extends outwardly.

The clip 4 comprises a substantially rectangular main plate 41 with a middle window, a pair of hooks 42 extending from one side of the main plate 41, a anti-rotation bar 43, and a extending portion 44 extending from the opposite side of the main plate 41. A pair of clasping portions 411 bends toward the housing 2 in a middle of the main plate 41 for pressing the LGP 8. The width of the hook 42 is slightly less than the width of the slot 321, and the hook 42 is pivotably mounted in the slots 321.

The lever 5 comprises a operation lever 51 and an mounting lever 52 perpendicular to the operation lever 51. The mounting lever 52 defines a pair of support portion 521 for being restricted in the restricting portion 322 of the stiffener 3 and a middle pressing portion 522. The pressing portion 522 can rotate in the recess 323 of the stiffener 3 for pressing the extending portion 44.

In use of the connector 1, the LGP 8 is disposed onto the housing 2. The clip 4 is then rotated downwardly to a horizontal closed position. When the lever 5 is actuated to press the extending portion 44 of the clip 4, the clasping portions 411 of the clip 4 press down on the LGP 8, and the lever 5 simultaneously pulls up the end of the stiffener 3 thereat to counterbalance the pressing forces. In addition, the hooks 42 of the clip 4 tend to pull up the opposite end of the stiffener 4 thereat, to counterbalance the pressing forces of the clasping portions 411 of the clip 4.

Said pulling up forces operate on the opposite ends of the stiffener 4 respectively, and the pressing forces of the clasping portions 411 operate to press a center portion of the LGP 8. The stiffener 3 tends to bend upward in the two ends that define the lever 5 and clip 4. Because the gap A is formed between the raised second steps 210 and corresponding side bars 311, the ends of the stiffener 3 have enough room to bend, and will not push the housing 2 to distort upwardly. Therefore, the distortion of the housing 2 is diminished, and reliable electrical connecting performance can be achieved.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array connector for interconnecting a land grid package and a circuit substrate, the land grid array connector comprising:

a housing comprising a mounting portion and a supporting portion, each side of the supporting portion extending beyond corresponding side of the mounting portion to form a pair of first steps and a pair of second steps;

a stiffener defined around the housing, the stiffener comprising a bottom plate and a plurality of side walls extending upwardly from the bottom plate, the bottom plate defining a window for receiving the mounting portion and a plurality of connecting portions therearound;

a clip having a plurality of hooks for pivotably engaging with one side wall of the stiffener;

a lever engaged in an opposite side wall of the stiffener;

wherein the first steps seat on corresponding connecting portions, the second steps correspond to two opposite lengthwise ends of the stiffener that engage the lever and the clip respectively, each second step and the corresponding connecting portion define a gap therebetween so as to compensate the upward deflection of said two opposite lengthwise ends of the stiffener due to tensional forces derived from the clip when the land grid package is installed into the housing.

2. The land grid array connector as claimed in claim 1, wherein each first step defines a slant surface in two ends thereof to connect with the second step.

3. The land grid array connector as claimed in claim 2, wherein at least one side of the mounting portion defines a plurality of protrusions, corresponding edges of the window define a plurality of recesses for engaging with the protrusions of the mounting portion.

4. The land grid array connector as claimed in claim 3, wherein the first steps are parallel to each other, and the second steps are perpendicular to the first steps.

5. The land grid array connector as claimed in claim 1, wherein gap between the second step and corresponding connecting portion is tapered.

6. A land grid array connector for electrically interconnecting a land grid package and a circuit substrate, the land grid array connector comprising:
 a housing;
 a stiffener defined around the housing, the stiffener comprising a bottom plate and a plurality of side walls extending upwardly from the bottom plate;
 a clip for pivotably engaging with one side wall of the stiffener;
 a lever engaged in an opposite side wall of the stiffener;
 wherein the housing defines two raised lower surfaces in two opposite lengthwise ends thereof, said lengthwise ends are corresponding to two lengthwise ends of the stiffener that engage the lever and clip respectively, and each lower surface and the bottom plate define a gap therebetween so as to compensate the upward deflection of said two opposite lengthwise ends of the stiffener due to tensional forces derived from the clip when the land grid package is installed into the housing.

7. The land grid array connector as claimed in claim 6, wherein the housing defines a mounting portion and a supporting portion.

8. The land grid array connector as claimed in claim 7, wherein each side of the supporting portion extends beyond corresponding side of the mounting portion.

9. The land grid array connector as claimed in claim 8, wherein the bottom plate defines a window and a plurality of connecting portion therearound, the window receives the mounting portion and the connecting portion supports the supporting portion.

10. The land grid array connector as claimed in claim 9, wherein the supporting portion defines a slant surface thereof to connect with the raised lower surface.

11. The land grid array connector as claimed in claim 10, wherein at least one side of the mounting portion defines a plurality of protrusions, corresponding edges of the window define a plurality of recesses for engaging with the protrusions of the mounting portion.

12. The land grid array connector as claimed in claim 6, wherein gap between the lower surface and corresponding connecting portion is tapered.

13. A land grid array connector for interconnecting a land grid package and a circuit substrate, the land grid array connector comprising:
 a housing defining an upward cavity for receiving the land grid package, and a central mounting portion surrounded by a circumferential supporting portion;
 a stiffener attached to a bottom portion of the housing, the stiffener comprising a bottom plate defining a window receiving the mounting portion therein and surrounded by a circumferential connecting portion in vertical alignment with the circumferential supporting portion;
 a clip pivotably engaging with one end of the stiffener; and
 a lever engaged in an opposite end of the stiffener for locking said clip in position; wherein
 only a lateral section of said circumferential supporting portion downwardly supportably abuts against a corresponding section of the circumferential connecting portion in a vertical direction so as to compensate the upward deflection of said two opposite lengthwise ends of the stiffener due to tensional forces derived from the clip when the land grid package is installed into the housing.

14. The connector as claimed in claim 13, wherein the circumferential connecting portion essentially provides a flat face while the circumferential support portion defines a downward offset structure facing said flat face for abutment with the flat face.

15. The connector as claimed in claim 14, wherein a gap formed between the flat face and the offset structure is located around a corner of said supporting portion.

\* \* \* \* \*